United States Patent [19]

Kayanuma et al.

[11] Patent Number: 5,397,729
[45] Date of Patent: Mar. 14, 1995

[54] METHOD FOR FABRICATION OF SEMICONDUCTOR DEVICE HAVING POLYCRYSTALLINE SILICON AND METAL SILICIDES

[75] Inventors: Sachiro Kayanuma, Nobeoka; Koji Iki, Atsugi, both of Japan

[73] Assignee: Asahi Kasei Microsystems Co., Ltd., Tokyo, Japan

[21] Appl. No.: 76,119

[22] Filed: Jun. 14, 1993

[30] Foreign Application Priority Data

Jun. 15, 1992 [JP] Japan .................................. 4-155335

[51] Int. Cl.6 ...................... H01L 21/70; H01L 27/00
[52] U.S. Cl. ........................................ 437/52; 437/60; 437/919; 437/200
[58] Field of Search ................ 437/52, 919, 47, 918, 437/60

[56] References Cited

U.S. PATENT DOCUMENTS

| 4,208,781 | 6/1980 | Rao et al. | 437/47 |
| 4,392,299 | 7/1983 | Shaw | 29/590 |
| 4,577,390 | 3/1986 | Haken | 437/919 |
| 5,025,741 | 6/1991 | Suwanai et al. | 437/52 |

FOREIGN PATENT DOCUMENTS

| 61-43464 | 3/1986 | Japan . |
| 61-255050 | 11/1986 | Japan . |
| 62-118569 | 5/1987 | Japan . |
| 62-31506 | 7/1987 | Japan . |
| 63-40357 | 2/1988 | Japan . |
| 1-128460 | 5/1989 | Japan . |

Primary Examiner—Olik Chaudhuri
Assistant Examiner—H. Jey Tsai
Attorney, Agent, or Firm—Finnegan, Henderson Farabow, Garrett & Dunner

[57] ABSTRACT

A method of fabricating a semiconductor device having a semiconductor substrate, a MOS transistor formed on one surface of the semiconductor substrate, and a capacitor is disclosed. The MOS has a gate electrode with a polycrystalline silicon layer and a metal silicide layer. The capacitor includes a first polycrystalline silicon layer which forms a lower electrode layer, an insulating interlayer, and a second polycrystalline silicon layer which forms an upper electrode, the first and second polycrystalline silicon layers sandwiching the insulating interlayer.

9 Claims, 7 Drawing Sheets

METHOD FOR FABRICATION OF SEMICONDUCTOR DEVICE HAVING POLYCRYSTALLINE SILICON AND METAL SILICIDES

BACKGROUND OF THE INVENTION

1. Field of the Invention

The present invention relates to a semiconductor device and a method for the fabrication thereof, and more particularly to a semiconductor device suitable for use in an analog circuit of the type in which a capacitor comprises polycrystalline silicon layers, especially a switched capacitor circuit, and a method for the fabrication of such a semiconductor device.

2. Description of the Prior Art

Miniaturization (that is, the reduction in size and weight) of semiconductor devices has recently advanced remarkably, resulting in reduction in size of gates created in each element and narrowing of the line width of interconnection and intraconnection wiring or lines. In order to overcome the short channel effect due to extremely narrow width of interconnection and intraconnection lines or wiring, Japanese Patent Application Publication No. 31506/1987 discloses the so-called lightly doped drain or LDD structure in which an insulating layer is formed by CVD (Chemical Vapor Deposition) by utilizing thermal decomposition of tetraethoxysilane (TEOS) and the side walls are defined by an anisotropic dry etching process, thus defining a double-construction source as well as a double-construction drain. In addition, the reduction in line width of the inter- and intraconnections due to miniaturization has caused the increase of resistance value. This results in the delay of signal transmission. In order to overcome this problem, U.S. Pat. No. 4,392,299 discloses a structure in which a metal silicide is deposited over one surface of a polycrystalline wafer to form gates and wiring having low resistances.

However, since in general, an analog circuit includes a relatively large number of resistors and capacitors, when a resistor having a high resistance is formed by a wiring created by the aforementioned lamination of the low resistance polycrystalline silicon and the silicide, there arises a problem that the length of wiring must be large enough. This inevitably leads to increase in the area of the semiconductor chip used.

FIG. 1 is a circuit diagram schematically showing a conventional switched capacitor or SCF, in which each of C1 and C2 comprises a plurality of unit capacitors. Referring to FIGS. 2A to 2I, description will be made of a conventional method for the production of a semiconductor device containing such unit capacitors. First, as shown in FIG. 2A, a field oxide layer 2 is grown over one surface of a semiconductor wafer 1, and then a first polycrystalline silicon layer 3 is formed over the upper or exposed surface of the field oxide layer 2 by, for example, thermal decomposition of $SiH_4$ gas. Into the first polycrystalline silicon layer 3, there is diffused $POCl_3$ or the like so that the first polycrystalline silicon layer 3 is doped with phosphorus as impurity in a high concentration, thereby creating a heavy-doped layer $H_1$. Next, as shown in FIG. 2B, after a photoresist material 8 is coated over both a transistor formation region A and a capacitor formation region B, respectively, the first polycrystalline silicon layer 3 is subjected to patterning by photolithographic and etching processes, to form a gate electrode 3A ($H_1$) and a lower capacitor electrode 3B ($H_2$), respectively (See FIG. 2C). In FIGS. 2A to 2H, reference numeral 10 indicates a gate oxide layer.

Thereafter, as shown in FIG. 2D, by utilizing, for example, a thermal oxidation or CVD process, an insulating interlayer 4 is formed over the exposed surfaces of the heavy-doped layers $H_1$. Next a second polycrystalline silicon layer 5 is formed over the exposed surfaces of the insulating layer 4 (See FIG. 2E). The second polycrystalline silicon layer 5 is doped with phosphorus to a high concentration by a process similar to that employed in the formation of the first polycrystalline silicon layer 3. The second layer 5 has a low resistance and, hence, it is called a heavy doped layer $H_2$ (See FIG. 2F). Thereafter, a photoresist land 9 is formed over the heavy-doped layer 5 as shown in FIG. 2G, and then the heavy-doped layer 5 is patterned by, for example, a photolithographic process, to thereby form a required pattern as shown in FIG. 2H.

FIGS. 3A to 3I show schematic sectional views showing semiconductors, respectively, in respective steps of a conventional method for fabricating a semiconductor device in which process the second polycrystalline silicon layer 5 is patterned first and then the first polycrystalline silicon layer 3 is patterned. In the above described fabrication methods, the first polycrystalline silicon layer contains or is doped with impurities in high concentration in order to decrease resistances of the gate electrode and a poly-resistor (not shown). As a result, crystal grains grow during the doping or heat-treatment step of the lower electrode of the capacitor formed with the first polycrystalline silicon layer, resulting in that the layer surface becomes uneven. In the case of a unit capacitor formed on the uneven surface of the polycrystalline silicon layer 3, the degree of precision or specific ratio, that is, the ratio of capacitance of the capacitor $C_2$ to that of the capacitor $C_1$ shown in FIG. 1, is decreased. For instance, such degree of precision determines the characteristics not only of an integrator but also SCF. Furthermore, when SCFs include capacitors with low degrees of precision or specific capacitance ratios, their characteristics fluctuate one from another considerably.

Furthermore, the gate oxide layers or insulating interlayers suffer from decrease in their breakdown voltage due to contamination with impurities from metal silicides and the like. This raises a problem that when the gate oxide layers and the insulating interlayers of the capacitors are formed after the formation of the metal silicide layer, reliability is deteriorated. In addition, there has been a demand for forming the gate oxide layer and the insulating interlayer of a capacitor independently of each other so that there can be used different oxidation processes suitable for the gate oxide layer and insulating interlayer, perceptively.

SUMMARY OF THE INVENTION

In view of the above, an object of the present invention is to provide a semiconductor device suitable for use in analog circuits and a method for the fabrication of such a semiconductor device.

Another object of the present invention is to provide a semiconductor device which includes a capacitor having a high specific capacitance ratio and a low resistance polycrystalline silicon electrode and a resistor as well as a method for the fabrication of such a semiconductor device.

According to a first aspect, the present invention provides a semiconductor device comprising: a semiconductor substrate; a MOS transistor formed on one surface of the semiconductor substrate and having a gate electrode having: a polycrystalline silicon layer, and a metal silicide layer; and a capacitor including: a first polycrystalline silicon layer which forms a lower electrode layer, an insulating interlayer, and a second polycrystalline silicon layer which forms an upper electrode, the first and second polycrystalline silicon layers sandwiching the insulating interlayer.

Here, the capacitor may further comprise an insulating layer, the insulating layer covering the upper electrode and side surfaces thereof.

The metal silicide layer may consist of at least one metal silicide selected from the group consisting of $WSi_2$, $MoSi_2$, $TiSi_2$, $TaSi_2$ and $CoSi_2$.

The insulating interlayer may consist of $SiO_2$.

The insulating layer may consist of $SiO_2$.

The insulating layer may consist of SiN.

The first polycrystalline silicon layer may have a sheet resistance within the range of from 30 and $1000\Omega/\square$.

The capacitor may be a unit capacitor.

The resistance value of the lower electrode portion may be higher than those of other polycrystalline silicon layers.

According to a second aspect, the present invention provides a semiconductor device comprising: a semiconductor substrate; a MOS transistor formed on one surface of the semiconductor substrate and having a gate electrode having: a polycrystalline silicon layer, and a metal silicide layer; a capacitor including: a first polycrystalline silicon layer which forms a lower electrode layer, an insulating interlayer, and a second polycrystalline silicon layer which forms an upper electrode, the first and second polycrystalline silicon layers sandwiching the insulating interlayer; and a resistor consisting of a single polycrystalline silicon layer.

According to a third aspect, the present invention provides a semiconductor device comprising a capacitor including: a first polycrystalline silicon layer which forms a lower electrode layer, an insulating interlayer, and a second polycrystalline silicon layer which forms an upper electrode, wherein the lower electrode layer has an impurity concentration lower than that of a portion surrounding the lower electrode, and a sheet resistance value within the range of from 30 to $1000\Omega/\square$.

According to a fourth aspect, the present invention provides a method for fabricating a semiconductor device comprising the steps of: (a) forming over one surface of a semiconductor substrate a field oxide layer and a gate oxide layer; (b) depositing a first polycrystalline silicon layer; (c) forming an insulating layer over the first polycrystalline silicon layer; (d) etching the second polycrystalline silicon layer excepting a portion which is to become an upper electrode of a capacitor; (e) selectively covering a first mask over the upper electrode layer and its peripheral portion; (f) forming a metal silicide layer; (g) forming a second mask over a portion of the metal silicide layer which is to become a gate electrode of a MOS transistor; and (h) etching the first polycrystalline silicon layer and the metal silicide layer; whereby forming a gate electrode consisting of the lamination of the polycrystalline silicon layer and the metal silicide layer and a capacitor consisting of the lower and upper electrodes and the insulating interlayer of the silicon oxide layer.

Here, the first mask may be an insulating layer.

The first mask may be $SiO_2$ deposited by a CVD process.

The first mask may be SiN deposited by a CVD process.

The metal silicide layer may consist of at least one metal silicide selected from the group consisting of $WSi_2$, $MoSi_2$, $TiSi_2$, $TaSi_2$ and $CoSi_2$.

The first polycrystalline silicon layer may be doped with impurities in such an amount that the first polycrystalline silicon layer has a sheet resistance of from 30 to $1,000\Omega/\square$.

According to a fifth aspect, the present invention provides a method for fabricating a semiconductor device comprising the steps of: (a) forming over one surface of a semiconductor substrate a field oxide layer and a gate oxide layer; (b) depositing a first polycrystalline silicon layer; (c) forming an insulating layer over the first polycrystalline silicon layer; (d) forming a second polycrystalline silicon layer over the insulating layer; (e) etching the second polycrystalline silicon layer excepting a portion thereof which is to become an upper electrode layer of a capacitor; (f) selectively covering the upper electrode layer and the peripheral surface thereof and a portion which is to become a resistor consisting of a single polycrystalline silicon layer; (g) forming a metal silicide layer; (h) forming a second mask over a portion which is to become a gate electrode of a MOS transistor; and (i) etching the first polycrystalline silicon layer and the metal silicide layer; whereby forming a gate electrode consisting of the lamination of the polycrystalline silicon layer and the metal silicide layer, a capacitor consisting of the lower and upper electrodes of the polycrystalline silicon and the insulating interlayer, and a resistor consisting of said polycrystalline silicon layer.

Here, the second polycrystalline silicon layer and then the insulating layer over the first polycrystalline silicon layer are etched; and thereafter the and second polycrystalline silicon layer and a portion of the first polycrystalline silicon layer not covered with the second polycrystalline silicon layer are doped with impurities to decrease resistance values of the second polycrystalline silicon layer and the portion of the first polycrystalline silicon layer which is covered with the second polycrystalline silicon layer.

According to a sixth aspect, the present invention provides a method for fabricating a semiconductor device comprising the steps of: (a) forming over an oxide layer formed on one surface of a semiconductor substrate a first polycrystalline silicon layer; (b) diffusing impurities into the first polycrystalline silicon layer in such an amount that resistance of the first polycrystalline silicon layer is controlled to be from 30 to $1,000\Omega/\square$; (c) forming a second polycrystalline silicon layer over the step (b) to become an upper electrode of a capacitor through an insulating layer; (d) patterning the second polycrystalline silicon layer to form an upper electrode of a unit capacitor; (e) diffusing impurities into the first polycrystalline silicon layer through a mask which is a left portion of the second polycrystalline silicon layer formed by performing the patterning step, whereby increasing impurity concentration in the first polycrystalline silicon layer excepting the portion whose sheet resistance is controlled and which underlies the second polycrystalline silicon layer; and (f) patterning the first polycrystalline silicon layer to define a gate and a lower electrode of the unit capacitor.

According to a seventh aspect, the present invention provides a method for fabricating a semiconductor device comprising the steps of: (a) forming over the oxide layer formed over one surface of a semiconductor substrate a first polycrystalline silicon layer; (b) diffusing impurities into the first polycrystalline silicon layer in such an amount, that the sheet resistance thereof is controlled within a range from 30 to 1,000Ω/□; (C) patterning the first polycrystalline silicon layer to define a gate and a lower electrode of a capacitor; (d) forming an insulating interlayer over the first polycrystalline silicon layer which is patterned by the patterning step, and thereafter forming over the insulating interlayer a second polycrystalline silicon layer which is to become the upper electrode of the capacitor; (e) patterning the second polycrystalline silicon layer; and (f) diffusing impurities into the second polycrystalline silicon layer to increase impurity concentration of a portion of the first polycrystalline silicon layer which underlies the second polycrystalline silicon layer and which is other than a portion of the first polycrystalline silicon layer whose sheet resistance is controlled.

According to the present invention, there can be fabricated a remarkably high speed transistor including a gate in the form of a lamination consisting of a polycrystalline silicon layer and a metal silicide layer, and a capacitor which has excellent voltage coefficient and consists of upper and lower electrodes fabricated with polycrystalline silicon and an insulating interlayer which consists of a thermally oxidized layer of polycrystalline silicon. Formation of the gate oxide layer of the transistor prior to the diffusion of high concentration impurities, and formation of an insulating interlayer prior to the formation of a metal silicide layer, on one hand, prevent the insulating interlayers from being contaminated with impurities and silicides, and, on the other hand, makes it possible to form the oxidation of the gate oxide layer independently of the oxidation of the insulating interlayer, thereby enabling the oxidation of the gate oxide layer and the insulating interlayer to be carried out under different conditions, respectively. Thus, the present invention can provide semiconductor devices highly reliable in operation.

Furthermore, the first mask covers the top surface and side surfaces of the upper electrode so that the upper electrode can be prevented from being contaminated with metal silicides upon etching and the undesired etching of the upper electrode can be prevented. Moreover, in addition to the transistor and the capacitor of the types described above, respectively, a high resistor element consisting of a monolayer structure of polycrystalline silicon having a high resistance can be fabricated on the same wafer or substrate. Thus, there can be fabricated on the same wafer or substrate a capacitor having an excellent voltage coefficient, a resistor having a high specific resistance, a gate having a high speed and wiring or conductors.

By controlling the value of the sheet resistance of the lower electrode of a unit capacitor to be within the range from 30 to 1,000Ω/□, a decrease of the precision ratio of the unit capacitor can be prevented, and thus the performance of SCFs to which the present invention is applied can be much increased. Furthermore, when the second polycrystalline silicon layer is doped, the resistance values of the gate electrode and the resistor formed by the first polycrystalline silicon layer also decrease. As a result, according to the present invention, the performance of SCF can be increased while maintaining the value of resistance of the gate electrode without causing the decrease of the degree of the ratio precision of the unit capacitor.

In addition, according to the present invention, doping of the first and second polycrystalline silicon layers by a thermal diffusion process enables mass production of semiconductor devices.

The above and other objects, effects, features and advantages of the present invention will become more apparent from the-following description of embodiments thereof taken in conjunction with the accompanying drawings.

DETAILED DESCRIPTION OF THE INVENTION

Figure 1:
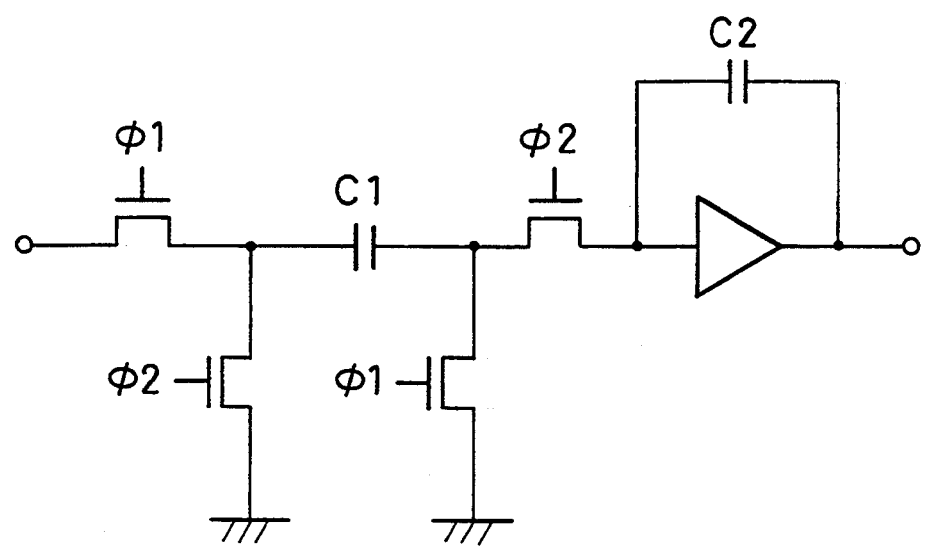
FIG. 1 is a circuit diagram showing a conventional switched capacitor field.
Figure 2A:
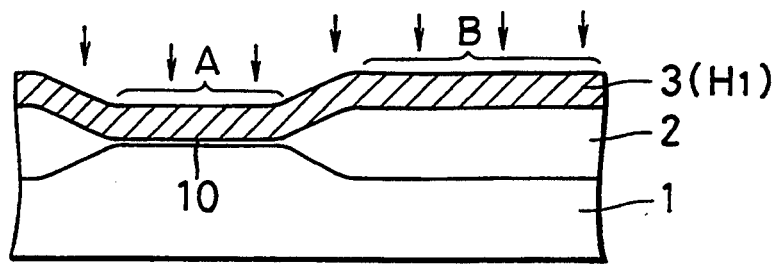
FIGS. 2A to 2H are schematic sectional views showing semiconductors, respectively, in respective steps of a conventional method for fabricating a semiconductor device.
Figure 2B:
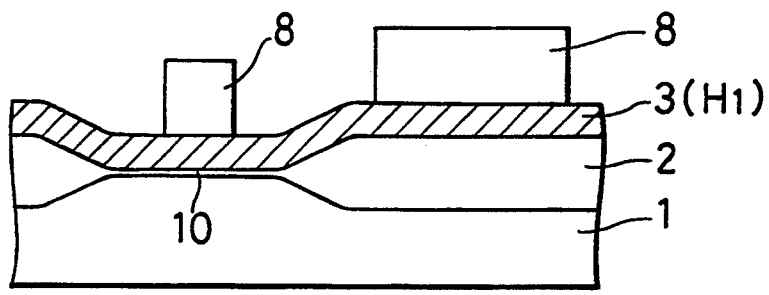
Figure 2C:
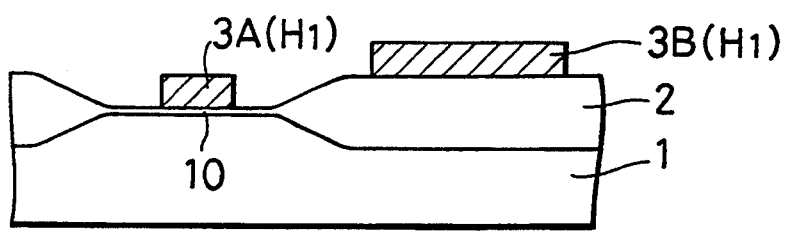
Figure 2D:
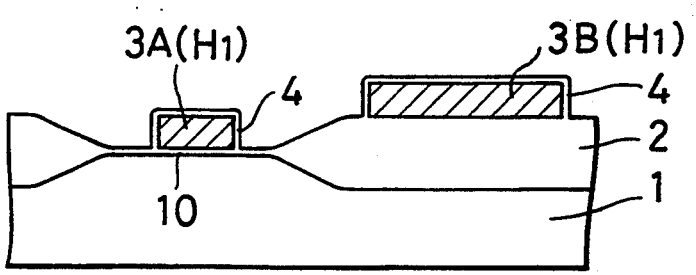
Figure 2E:
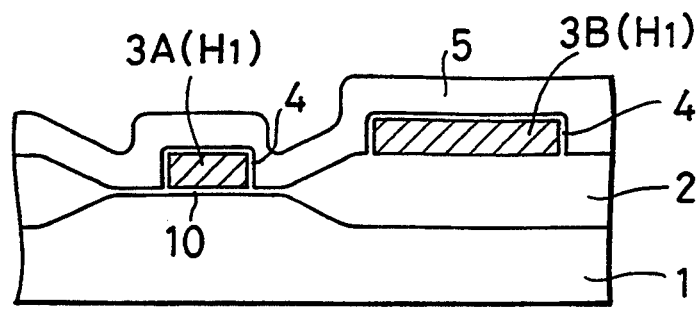
Figure 2F:
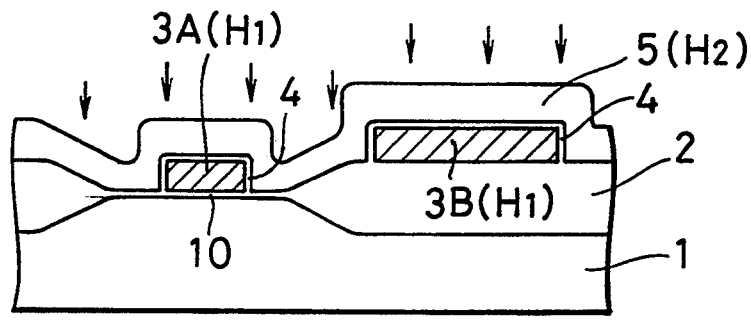
Figure 2G:
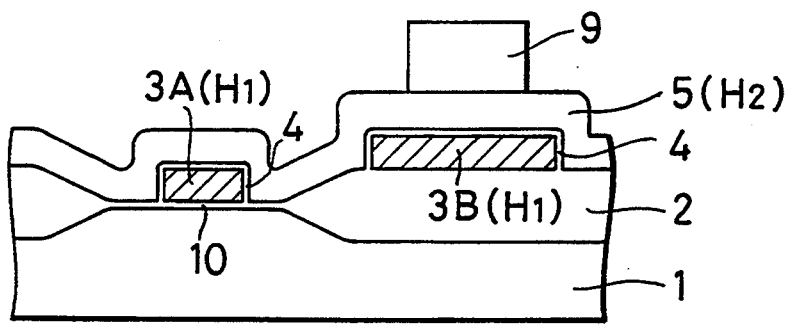
Figure 2H:
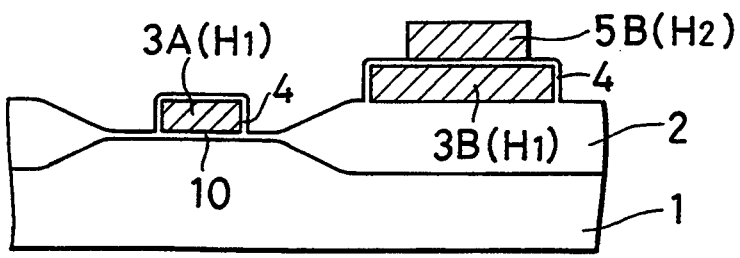
Figure 3A:
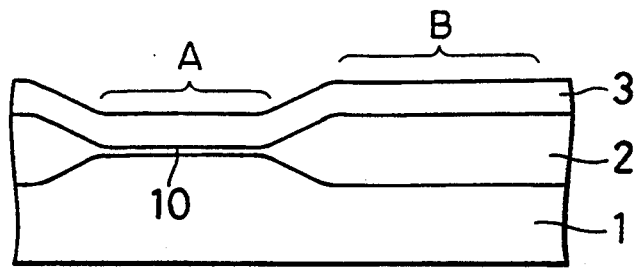
FIGS. 3A to 3I are schematic sectional views showing semiconductors, respectively, in respective steps of a conventional method for fabricating a semiconductor device.
Figure 3B:
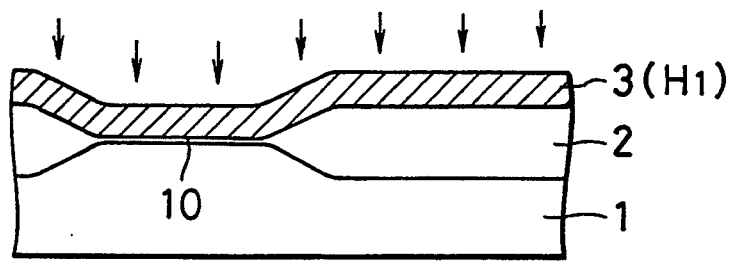
Figure 3C:
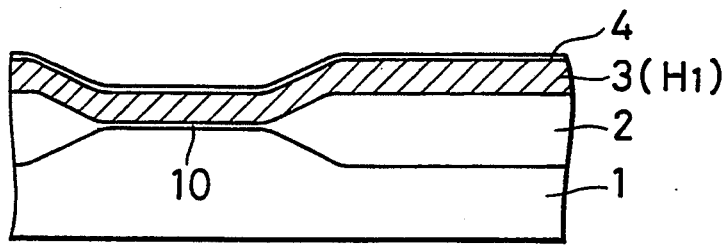
Figure 3D:
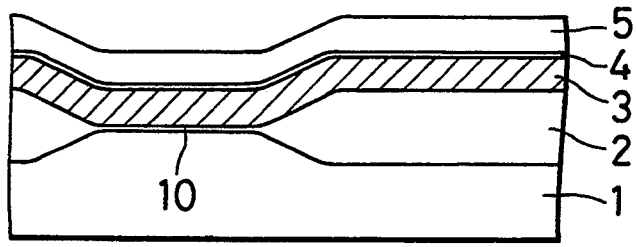
Figure 3E:
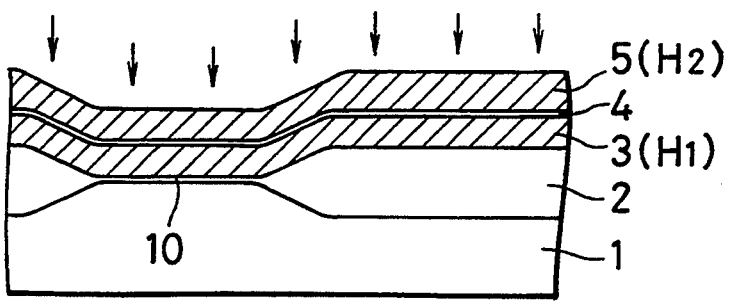
Figure 3F:
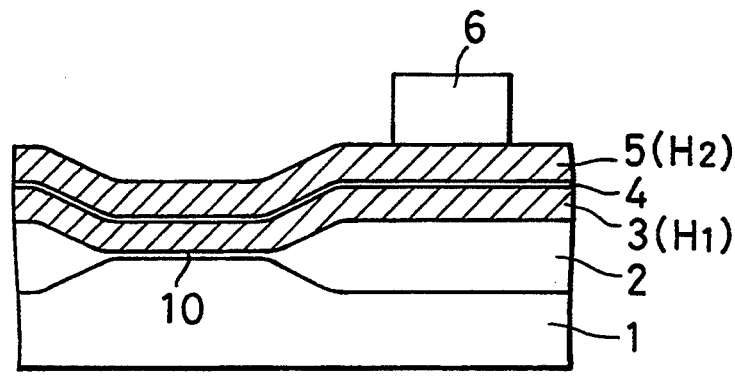
Figure 3G:
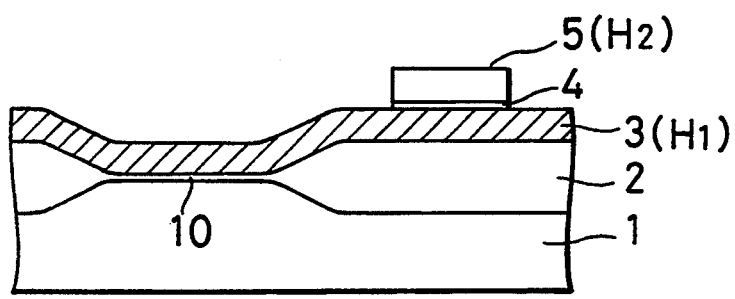
Figure 3H:
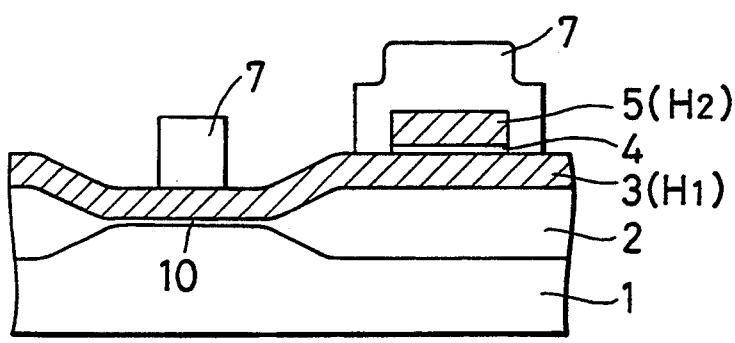
Figure 3I:
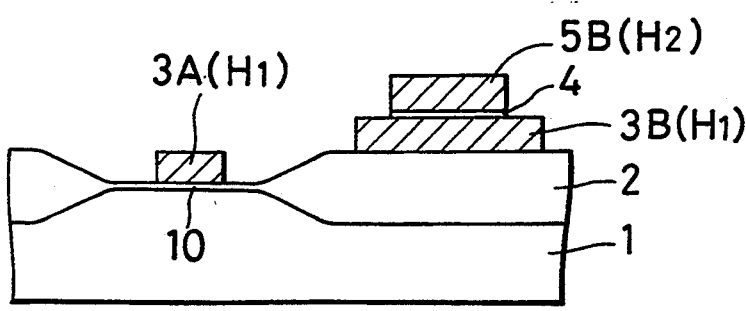

A field oxide layer for separating elements is formed over a major surface of a semiconductor wafer such as a silicon wafer. Next, a gate oxide layer is formed over an area of the major surface of the semiconductor wafer which area is not covered with the field oxide layer. A first polycrystalline silicon is deposited over the gate oxide layer and the field oxide layer on the semiconductor wafer, and then impurities such as phosphorus are diffused into the first polycrystalline silicon layer. Next, an insulating layer consisting of SiN or $SiO_2$ is formed over the surface of the first polycrystalline silicon layer by oxidizing the first polycrystalline silicon layer in an oxidative atmosphere or by a suitable CVD process. Thereafter, a second polycrystalline silicon layer is formed over the insulating layer. For example, a suitable photoresist is used to define an upper electrode of a capacitor and then the second polycrystalline silicon layer is etched off to form an upper electrode layer. The upper electrode layer and its peripheral surface (top surface and side surfaces) are selectively covered by a first mask. The insulating layer of SiN or $SiO_2$ grown by a CVD process may be used as the first mask.

Thereafter, a metal silicide layer is formed, and then a second mask such as a photoresist is used to define a gate electrode of a MOS transistor. The first polycrystalline silicon layer and the metal silicide layer are etched. In order to form a metal silicide layer, there can be used at least one layer consisting of a metal silicide selected from high melting point metal silicides such as tungsten silicide (WSi), molybdenum silicide ($MoSi_2$), titanium silicide ($TiSi_2$), tantalum silicide ($TaSi_2$) and cobalt silicide ($CoSi_2$).

Thus, a gate electrode consisting of a lamination of a polycrystalline silicon layer and a metal silicide layer, and a capacitor consisting of electrodes of polycrystalline silicon layers and an insulating interlayer consisting of a silicon oxide layer can be formed on the same semiconductor wafer. As a result, interconnection and intraconnection conductors, or wiring portion, and gate electrode portion have low resistance values, and the capacitor portion has a high breakdown voltage as well as a high precision ratio.

When impurities are diffused into the first polycrystalline silicon layer in such an amount that the sheet resistance is between 30 and 1,000Ω/□, the growth of crystalline grains in the electrode portion can be suppressed so that a high surface smoothness of the electrode can be ensured. As a result, a precision ratio can be prevented from becoming low.

By covering, with the first mask, of the upper electrode layer and its peripheral surface as well the portion of the single polycrystalline silicon layer that is designed to become a resistor, there can be formed a gate electrode consisting of a lamination of the polycrystalline silicon layer and the metal silicide layer, a capacitor consisting of electrodes consisting Of polycrystalline silicon layers and an insulating interlayer consisting of silicon oxide, and a resistor consisting of the single polycrystalline silicon layer. As a result, in addition to the above-described capacitor and gate electrode, a resistor having a high resistance can be obtained. Hence, the chip size can be reduced.

Etching the second polycrystalline silicon layer and the insulating layer over the first polycrystalline silicon layer, and then doping with impurities the second polycrystalline silicon layer and the first polycrystalline silicon layer not covered with the second polycrystalline silicon layer to decrease the resistances of the second polycrystalline silicon layer and the first polycrystalline silicon layer not covered with the second polycrystalline silicon layer result in that not only the gate electrode but also the resistor, both of which are made of the first polycrystalline silicon layer, have decreased resistances when the second polycrystalline silicon layer is doped. Thus, according to the present invention, SCF performance can be improved without decreasing the precision ratio while maintaining the resistance of the gate electrode at a low level.

Further, in the present invention, doping of the first and second polycrystalline silicon layer can be performed by thermal diffusion method without deteriorating mass productivity.

DETAILED DESCRIPTION OF PREFERRED EMBODIMENTS

Some embodiments of the present invention will be described in detail with reference to the accompanying drawings in which same reference numerals are used to indicate same or similar parts.

Embodiment 1:

FIGS. 4A to 4F are cross sectional views showing semiconductors, respectively, in respective steps of a method for the fabrication of a semiconductor device in accordance with the present invention. More particularly, FIGS. 4A to 4F illustrate the steps of forming a capacitor which is one of important elements in CMOS analog circuits. In the case of a CMOS analog circuit, it is preferred to use a capacitor including electrodes each consisting of polycrystalline silicon and having excellent voltage and temperature characteristics, and an insulating interlayer consisting of a silicon oxide layer. Therefore, the instant embodiment provides a method for forming the above described insulating interlayer on the same wafer over which is also formed a MOS transistor using high-melting point metal silicide layers having excellent high speed characteristics as materials for defining the gate and wiring or conductors. It should be noted here that the wiring or conductors such as aluminum and passivation layers are not shown.

Now referring to FIGS. 4A to 4F, reference numeral 50 denotes a semiconductor wafer or substrate, 51 denotes a field oxide layer, 52 denotes a first polycrystalline silicon layer, 53 denotes an insulating interlayer, 54 denotes a second polycrystalline silicon layer, 55 denotes a gate oxide layer, 56 denotes a photoresist, 57 denotes an insulating layer which serves as a first mask, 58 denotes a photoresist for defining the first mask, 59 denotes a metal silicide layer, and 60 denotes a second mask.

Figure 4A:
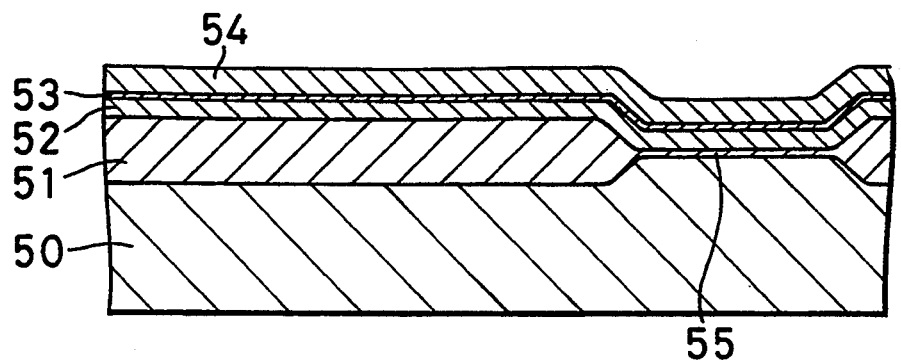
FIGS. 4A to 4F are schematic cross sectional views showing semiconductors, respectively, in respective steps of a method for fabricating a semiconductor device in accordance with an embodiment of the present invention.

In the first step shown in FIG. 4A, the field oxide layer is formed over a major surface of the silicon substrate 50 by any suitable conventional process and the gate oxide layer 55, which is used as a first insulating layer, is formed to a thickness of, for example, 250Å over an active region. Next, the polycrystalline silicon layer 52 is formed to a thickness of, for example, 3,000Å by an LPCVD (Low Pressure Chemical Vapor Deposition) process. The polycrystalline silicon layer 52 not only serves as a lower electrode of a capacitor but also constitutes a lower portion of a lamination which consists of a high-melting-point metal silicide layer and a polycrystalline silicon layer and which is used as a gate or a conductor. Thereafter, the polycrystalline silicon layer 52 is doped with phosphorus impurity by a gas phase diffusion process.

Then, the surface of the polycrystalline silicon layer 52 is subjected to thermal oxidation in an oxidative atmosphere, thereby forming the insulating interlayer 53, which has a thickness of, for instance, 450Å.

Next, the second polycrystalline silicon layer 54 is formed over the insulating interlayer 53 and is doped with phosphorus. The layer 54 becomes an upper electrode of the capacitor. The second polycrystalline silicon layer 54 is formed in substantially the same manner as the formation of the polycrystalline silicon layer 52.

Figure 4B:
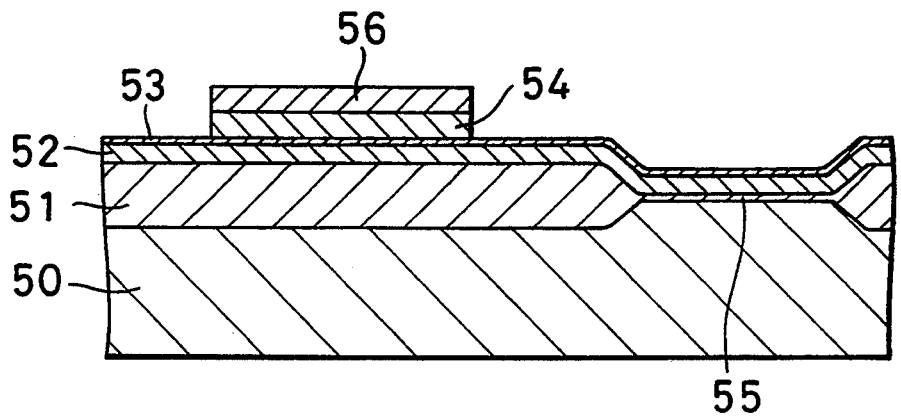

Thereafter, as shown in FIG. 4B, the photoresist 56 is applied to the portion which becomes the upper electrode of the capacitor, and then the polycrystalline silicon layer 54 is etched. In this case, the insulating layer 53 may be also etched.

Figure 4C:
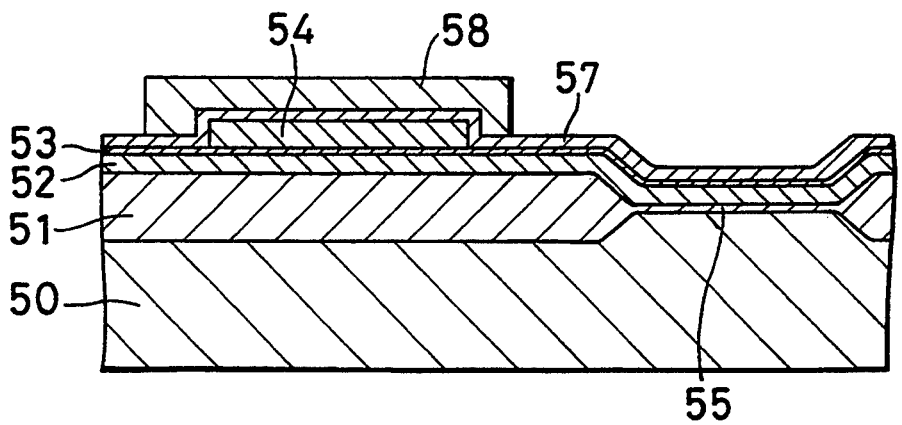

Next after the photoresist 56 is removed, as shown in FIG. 4C, the silicon oxide layer 57 is formed to a thickness of, for instance, 1,000Å by thermal cracking of TEOS (tetraethoxysilane), which serves as an insulating layer. The insulating layer 57 is not limited to the silicon oxide layer and other material may be used so far as it has high enough an etching selectivity coefficient as compared with the polycrystalline silicon layer 52. For example, a silicon nitride (SiN) layer can be used instead of the silicon oxide layer.

Figure 4D:
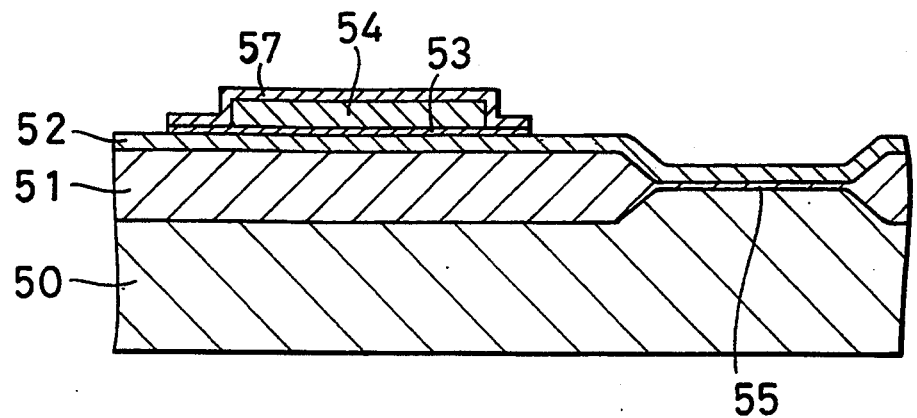

Furthermore, the photoresist 58 is applied to a portion of the polycrystalline silicon layer 52 over the silicon oxide layer 57 which portion is designed to become the lower electrode of the capacitor. Next, the silicon oxide layer 57 and the insulating interlayer 53 are etched and the resist 58 is removed to define the first masking 57 as shown in FIG. 4D. The first mask 57 extends to cover the top surface of the second polycrystalline silicon layer and its peripheral surface (side surfaces) which are to form the upper electrode of the capacitor. The first mask 57 serves as a mask when the metal silicide layer is etched as will be described hereinafter and prevents the contamination with metal particles scattered when the metal silicide layer is etched. Furthermore, the first mask 57 prevents short-circuiting between the upper and lower electrodes of the capacitor. Though not shown, the first mask 57, that is, the silicon oxide layer 57, is selectively left over a portion of the first polycrystalline silicon layer 54 which is to become a resistor so that a resistor can be formed having a high resistance value.

Figure 4E:
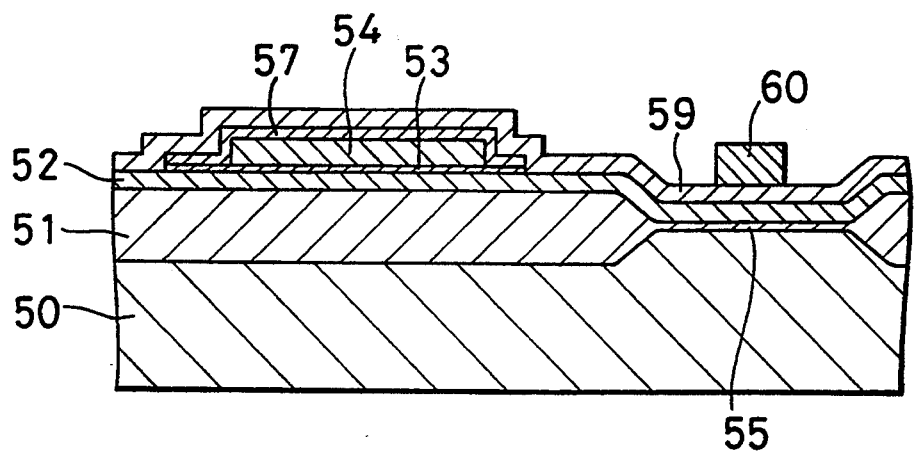

Next, as shown in FIG. 4E, the tungsten silicide layer 59 of, for instance, 2,000Å in thickness is formed. Thereafter, the second mask or resist 60 is formed over a portion which is to become a lamination consisting of the polycrystalline silicon layer and the silicide layer, and then both the tungsten silicide layer and the polycrystalline silicon layer are etched by a plasma etching process. In this case, the resist 60 is not etched, thereby giving rise to the lamination consisting of the polycrystalline silicon layer and the silicide layer. Such lamination serves as a gate electrode of the MOS transistor.

While the tungsten silicide over the silicon oxide layer 57 is etched, the silicon oxide layer 57 serves as a mask for the polycrystalline silicon layer 52, the insulating interlayer 53 and the polycrystalline silicon layer 54 under the silicon oxide layer 57, thereby forming a capacitor including the polycrystalline silicon layers 52 and 54 and the insulating interlayer 53. Due to the mask formed over the first polycrystalline silicon layer 52, the portion under the mask becomes a high resistance region without being covered with the tungsten silicide. Therefore, this region can be used as a resistor.

Figure 4F:
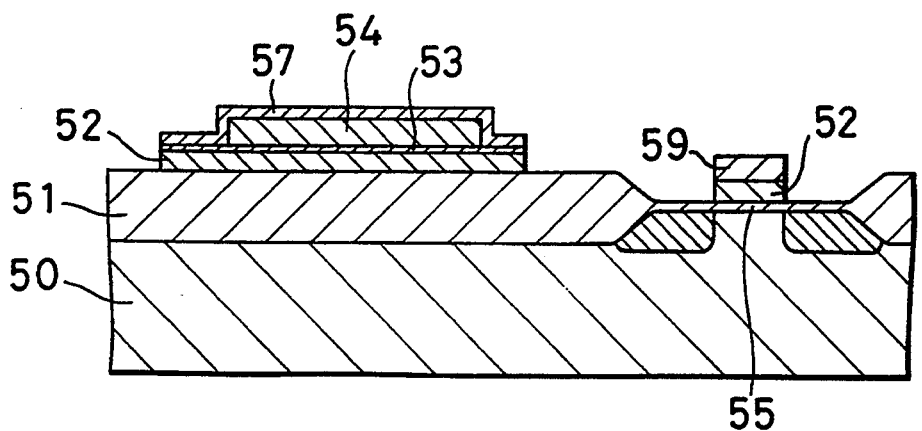

Thereafter, impurities are diffused into the active region by using the gate electrode as a mask, thus forming source and drain diffused regions as shown in FIG. 4F.

In the case of the capacitor fabricated in the first embodiment, its insulating interlayer can be formed independently of, for instance, the gate oxide layer. As a result, the insulating interlayer can be formed under the conditions suitable for the oxidation of the polycrystalline silicon and prior to the formation of the silicide. This prevents the insulating interlayer from being contaminated with impurities from the silicide, and makes the insulating interlayer highly reliable in operation. The gate of the transistor is in the form of the lamination consisting of tungsten silicide and the polycrystalline silicon layer so that the transistor has a low resistance and therefore operates at a high speed. Furthermore, the gate oxide layer can be formed prior to the formation of the polycrystalline silicon layer and the silicide layer. This makes the gate oxide layer highly reliable.

As described above, according to the first embodiment of the present invention, the gate oxide layer and the insulating interlayer of the capacitor can be created prior to the formation of the polycrystalline silicon layer and the silicide layer, and under the different conditions. In addition, the first mask covers the top and side surfaces of the upper electrode, thereby preventing contamination from metal silicide in the etching step and also preventing undesired etching of the upper electrode. While, in the first embodiment, the insulating interlayer has been described as being formed by thermal oxidation, it can be created by a suitable CVD process.

Embodiment 2

The steps of a fabrication method for fabricating a semiconductor device in accordance with the second embodiment are substantially similar to those shown in FIGS. 4A to 4F. The instant embodiment differs from the first embodiment in that the amount of phosphorus dopant to be diffused into the first polycrystalline silicon layer 3 is controlled to a value within the predetermined range such that the sheet resistance of the layer 3 becomes from 30 to 1,000$\Omega/\square$, or preferably from 35 to 1,000$\Omega/\square$, thereby making the first polycrystalline silicon layer 52 to become a lightly doped layer, and that the step of doping the second polycrystalline silicon layer 54 is performed after the patterning step.

First, the step of controlling the sheet resistance will be described. After its formation, the first polycrystalline silicon layer 52 of 3,500Å thick is doped with phosphorus under the predetermined conditions. For instance, the polycrystalline silicon layer 52 is doped with phosphorus for four minutes in a reaction chamber in which a gas mixture is introduced that consists of $N_2$ gas (5 liter/minute), $O_2$ gas (0.5 liter/minute) and $POCl_3$ gas (120 mg/minute) and heated at about 1,000° C. In this case, the sheet resistance of the first polycrystalline layer 52 can be controlled within the above described range. In the case of the polycrystalline silicon layer having a sheet resistance within the above-described range, even when the layer is heated during the doping step or undergoes the post heat-treatment step, no crystal grain will come into existence or grow within the layer so that its surface is very smooth (no ridges and valleys).

After the above-described sheet resistance control step, as shown in FIG. 4B, the resist 56 is formed over the surface of the second polycrystalline silicon layer 54 which is not doped with a dopant and then the second polycrystalline silicon layer 54 is patterned. In this case, the underlying insulating interlayer 53 may be also patterned. Thereafter, the doping is carried out under the same doping conditions as the above-described sheet resistance control step except that the surface of the first polycrystalline silicon layer 51 and the second polycrystalline silicon layer 52 are doped for nine minutes. In this step, the concentration of dopant (phosphorus) of the second polycrystalline silicon layer 54 which has underwent patterning becomes high to give rise to a heavily doped layer, and the dopant concentration of the exposed portion of the first polycrystalline silicon layer 52 not covered by the second polycrystalline silicon layer 54 is in excess of the dopant (phosphorus) concentration prior to the above-described doping step so that the first polycrystalline silicon layer 52 also becomes a heavily doped layer. The portion of the first polycrystalline silicon layer 52 which is covered with the second polycrystalline silicon layer 54 has the same dopant (phosphorus) concentration as that prior to the above-described doping step, and therefore, gives rise to a lightly doped layer. Thereafter, the steps shown in FIGS. 4C to 4F are carried out. As a result, there is obtained a semiconductor device which includes a unit capacitor having a predetermined structure, gate electrodes and a resistor.

In the case of the semiconductor device of the type described above, the portion of the first polycrystalline silicon layer 52 surrounded by the above-mentioned heavily doped layer has a dopant concentration within the predetermined range and is a lightly doped layer.

The lightly doped layer serves as the lower electrode of the capacitor while the heavily doped layer on the upper side of the lightly doped layer serves as the upper electrode of the capacitor. The heavily and lightly doped layers with the insulating interlayer 53 interposed therebetween constitute a unit capacitor. Each of the capacitors C1 and C2 in an SCF as shown in FIG. 1 consists of a plurality of such unit capacitors of the type described above.

According to the instant embodiment, the sheet resistance of the lightly doped layer, which is the lower electrode of the capacitor, has a resistance value within the predetermined range and the surface of the layer is not uneven so that the lightly doped layer will not reduce the precision ratio of the unit capacitor. Since the lightly doped layer whose surface is smooth is used as one of the electrodes of the unit capacitor, its precision ratio can be easily increased and therefore the SCF performance can be improved.

While it has been described that the second patterned polycrystalline silicon layer 52 undergoes the doping step for nine minutes, it is to be understood that the doping period can be varied between four and nine minutes so that the amount of dopant may be suitably controlled. In this case, the patterned second polycrystalline silicon layer 54 will not be converted into a heavily doped layer, but becomes a lightly doped layer as in the underlying layer 52. However, the dopant concentration of the portion in the vicinity of the first polycrystalline silicon layer 52 which is a lightly doped layer, becomes high and hence give rise to a heavily doped layer. In this case, the lightly doped portion of the first polycrystalline silicon layer 52 functions as the lower electrode of the capacitor as in the cases of the embodiments described above.

According to the second embodiment, not only the first polycrystalline silicon layer 52 but also the second polycrystalline silicon layer 54 can be so doped as to be converted into the lightly doped layers. In the above-described embodiments, any conventional thin layer deposition and impurity diffusion techniques can be used so that the mass productivity can be enhanced. While it has been described in the embodiments that the dopant is phosphorus, but the present invention is not limited thereto.

The present invention has been described in detail with respect to preferred embodiments, and it will now be obvious to one skilled in the art that changes and modifications may be made without departing from the invention in its broader aspects, and it is the intention, therefore, in the appended claims to cover all such changes and modifications as fall within the true spirit of the invention.

What is claimed is:

1. A method for fabricating a semiconductor device comprising the steps of:
   (a) forming on one surface of a semiconductor substrate a field oxide layer and a gate oxide layer;
   (b) depositing a first polycrystalline silicon layer;
   (c) forming an insulating layer over said first polycrystalline silicon layer;
   (d) depositing a second polycrystalline silicon layer on said insulating layer;
   (e) etching said second polycrystalline silicon layer outside a portion designated as an upper electrode layer of a capacitor;
   (f) selectively covering a first mask over said upper electrode layer and its peripheral portion;
   (g) forming a metal silicide layer;
   (h) forming a second mask over a portion of said metal silicide layer designated as a gate electrode of a MOS transistor; and
   (i) etching said first polycrystalline silicon layer and said metal silicide layer to form a gate electrode and a capacitor, said gate electrode comprising a lamination of said first polycrystalline silicon layer and said metal silicide layer, said capacitor comprising a lamination of said first and second polycrystalline silicon layers and said insulating layer.

2. The method for fabricating a semiconductor device as claimed in claim 1, wherein said first mask is an insulating layer.

3. The method for fabricating a semiconductor device as claimed in claim 1, wherein said first mask is $SiO_2$ deposited by a CVD process.

4. The method for fabricating a semiconductor device as claimed in claim 2, wherein said first mask is SiN deposited by a CVD process.

5. The method for fabricating a semiconductor device as claimed in claim 2, wherein said metal silicide layers comprises at least one metal silicide selected from the group consisting of $WSi$, $MoSi_2$, $TiSi_2$, $TaSi_2$ and $CoSi_2$.

6. The method for fabricating a semiconductor device as claimed in claim 1, wherein said first polycrystalline silicon layer is doped with impurities in such an amount that said first polycrystalline silicon layer has a sheet resistance of from 30 to $1,000\Omega/\square$.

7. A method for fabricating a semiconductor device comprising the steps of:
   (a) forming on one surface of a semiconductor substrate a field oxide layer and a gate oxide layer;
   (b) depositing a first polycrystalline silicon layer;
   (c) forming an insulating layer over said first polycrystalline silicon layer;
   (d) depositing a second polycrystalline silicon layer over said insulating layer;
   (e) etching said second polycrystalline silicon layer outside a portion designated as an upper electrode layer of a capacitor;
   (f) selectively covering a first mask over said upper electrode layer and the peripheral surface thereof and a portion designated as a resistor, said resistor comprising a single polycrystalline silicon layer;
   (g) forming a metal silicide layer;
   (h) forming a second mask over a portion of said metal silicide layer designated as a gate electrode of a MOS transistor; and
   (i) etching said first polycrystalline silicon layer and said metal silicide layer to form a gate electrode, a capacitor, and a resistor, said gate electrode comprising a lamination of said first polycrystalline silicon layer and said metal silicide layer, said capacitor comprising a lamination of said first and second polycrystalline silicon layers and said insulating interlayer.

8. A method for fabricating a semiconductor device as claimed in claim 7, wherein said second polycrystalline silicon layer and said insulating layer are etched; and thereafter said second polycrystalline silicon layer and a portion of said first polycrystalline silicon layer not covered with said second polycrystalline silicon layer are doped with impurities to decrease resistance values of said second polycrystalline silicon layer and said portion of said first polycrystalline silicon layer not covered with said second polycrystalline silicon layer.

9. A method for fabricating a semiconductor device as claimed in claim 7, wherein said MOS transistor comprising the capacitor and the gate electrode is fabricated in the form of a plurality of units for a switched capacitor filter.

* * * * *